(12) United States Patent
McNulty

(10) Patent No.: US 6,329,924 B1
(45) Date of Patent: Dec. 11, 2001

(54) WEARABLE ELECTRIC FIELD DETECTOR

(75) Inventor: William J. McNulty, River Forest, IL (US)

(73) Assignee: HD Electric Company, Waukegan, IL (US)

( * ) Notice: Subject to any disclaimer, the term of this patent is extended or adjusted under 35 U.S.C. 154(b) by 0 days.

(21) Appl. No.: 09/528,166

(22) Filed: Mar. 17, 2000

(51) Int. Cl.⁷ .................................................. G08B 21/00
(52) U.S. Cl. .......................... 340/660; 340/552; 340/649; 340/600; 340/661; 340/662; 340/628; 364/449
(58) Field of Search .................................. 340/552, 649, 340/600, 660, 661, 662, 628; 364/449

(56) References Cited

U.S. PATENT DOCUMENTS

| | | | |
|---|---|---|---|
| 3,309,690 | * 3/1967 | Moffitt | 340/258 |
| 3,369,175 | 2/1968 | Morris | 324/17 |
| 3,774,110 | * 11/1973 | Roveti | 324/133 |
| 3,786,468 | 1/1974 | Moffitt | 340/258 D |
| 3,878,459 | * 4/1975 | Hanna | 324/51 |
| 4,006,409 | 2/1977 | Adams | 324/51 |
| 4,349,783 | * 9/1982 | Robson | 324/457 |
| 4,350,951 | 9/1982 | Jasper | 324/133 |
| 4,605,905 | 8/1986 | Aslan | 330/9 |
| 4,649,375 | 3/1987 | Duppong et al. | 340/660 |
| 5,093,651 | * 3/1992 | Thomas | 340/628 |
| 5,103,165 | 4/1992 | Sirattz | 324/133 |
| 5,168,265 | 12/1992 | Aslan | 340/600 |
| 5,252,912 | 10/1993 | Merritt et al. | 324/72 |
| 5,256,960 | 10/1993 | Novini | 324/72 |
| 5,363,045 | 11/1994 | Martin et al. | 324/395 |
| 5,373,284 | 12/1994 | Aslan | 340/600 |
| 5,373,285 | 12/1994 | Aslan | 340/600 |
| 5,414,344 | * 5/1995 | Chinn | 324/72 |
| 5,600,307 | 2/1997 | Aslan | 340/600 |
| 5,666,949 | 9/1997 | Debe et al. | 128/202.22 |
| 5,708,970 | * 1/1998 | Newman et al. | 455/35.1 |

OTHER PUBLICATIONS

AVO International Flyer for LA500 Series Alarms–1997.

* cited by examiner

*Primary Examiner*—Daniel J. Wu
*Assistant Examiner*—Tai T. Nguyen
(74) *Attorney, Agent, or Firm*—Seyfarth Shaw

(57) ABSTRACT

A wearable electric field detector has a housing mountable on a user's person and including a sensing circuit responsive to an electric field to generate a signal which varies in proportion to the strength of the sensed field, and an alarm circuit coupled to the sensing circuit for producing an intermittent audible alarm signal, which has a repetition rate varying in proportion to the strength of the field, and a visible alarm signal. A mute circuit is manually activatable for selectively muting the audible alarm and then automatically reenabling it after a predetermined time period. The detector includes a manually-actuatable test circuit. There is no on-off switch, the detector being disabled by being disposed in a shielded carrying case.

15 Claims, 3 Drawing Sheets

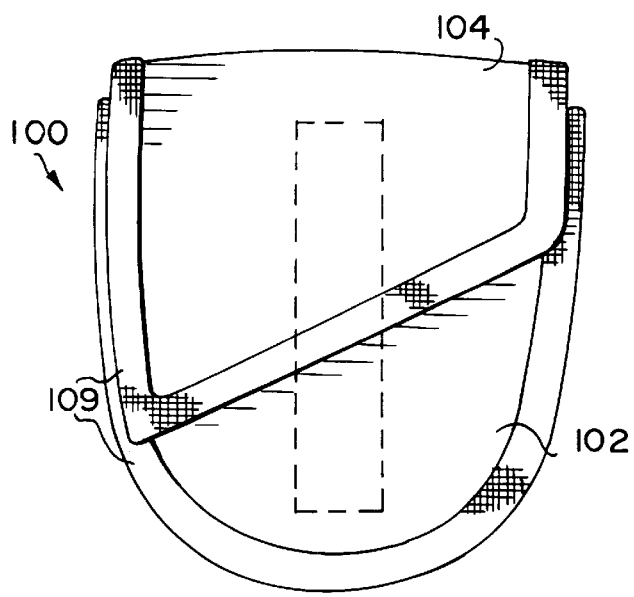
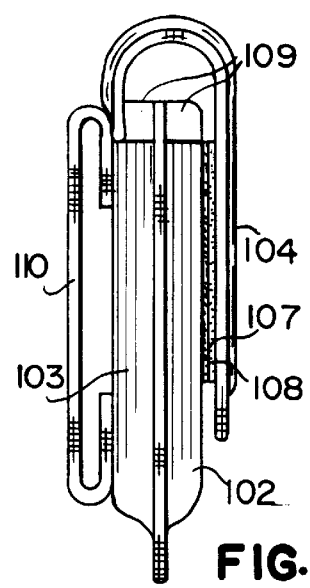
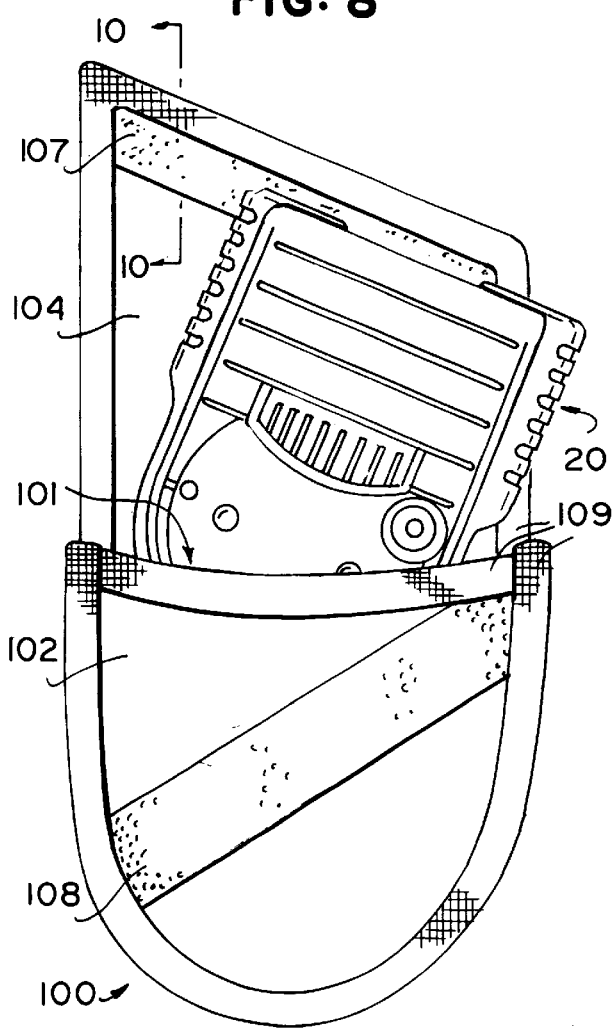
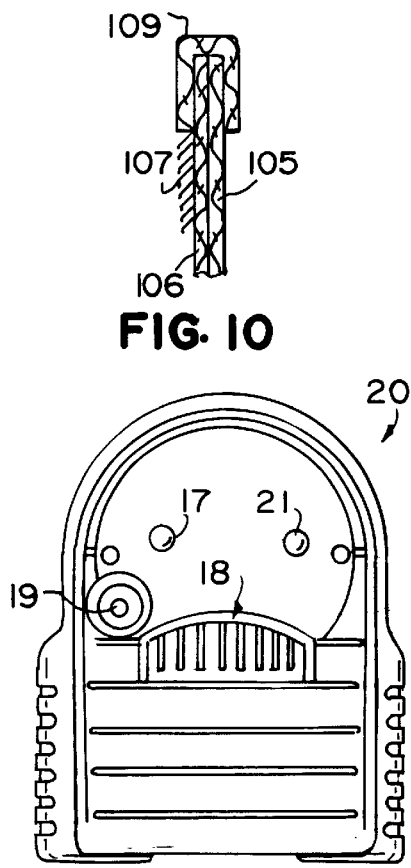
FIG. 8
FIG. 9
FIG. 10
FIG. 7
FIG. 5

WEARABLE ELECTRIC FIELD DETECTOR

BACKGROUND OF THE INVENTION

The present invention relates to electromagnetic radiation monitors of the type which may be worn by persons who may be exposed to potentially harmful levels of electromagnetic energy. The invention has particular application to monitors for electric fields, specifically the 16w-frequency fields of the type which surround high-voltage conductors, such as power transmission and distribution lines.

Transmission lines route high-voltage (e.g., 2,000 volts and higher) electrical power from power plants to main regional stations and local substations. Distribution lines route high-voltage electrical power from substations to end users. Many such lines are above ground and exposed to the elements, requiring frequent inspection and/or repair or maintenance. Contact with such high-voltage power lines can be lethal for workers and, therefore, there have heretofore been provided various types of monitors or detectors to sense the proximity to dangerous high-voltage power lines to warn workers before they reach a dangerous proximity. One such type of detector senses the electrical field surrounding a high-voltage conductor, the strength and extent of such fields being proportional to the voltage level. Such detectors typically provide an audible and/or visible indication of the detected field to warn the user.

Prior detectors of the personal or wearable type are battery-powered and have on/off switches. One difficulty, particularly with detectors having audible alarm signals, is that when a worker has to work for an extended period of time in a sensed electric field, the continuous audible alarm can become annoying. Thus, workers will frequently turn off the detector, which can be dangerous. Also, a worker must remember to turn the device on each time he wears it, and failure to remember this is also dangerous.

SUMMARY OF THE INVENTION

It is a general object of the invention to provide an improved electric field detector of the wearable type, which avoids the disadvantages of prior detectors while affording additional structural and operating advantages.

An important feature of the invention is the provision of a wearable electric field detector which prevents dangerous user deactivation.

In connection with the foregoing feature, another feature of the invention is the provision of a detector of the type set forth with an audible alarm device which can be selectively muted by the user in a safe manner.

In connection with the foregoing feature, another feature of the invention is the provision of a detector of the type set forth with an automatically time-limited muting function.

Still another feature of the invention is the provision of a shielded carrying case for a detector of the type set forth, so that the detector need not have an on-off switch.

Certain ones of these and other features of the invention may be attained by providing a wearable electric field detector comprising: a housing adapted to be mounted on a user's person, a sensing circuit disposed in the housing and responsive to an electric field for generating a sense signal which varies in proportion to the strength of the sensed field; an alarm circuit coupled to the sensing circuit for producing an indication of the sensed field, the alarm circuit including an audio annunciator for producing an intermittent audible alarm signal with a repetition rate which varies in proportion to the sense signal; and a mute circuit selectively operable when the audio annunciator is active for deactivating the audio annunciator.

Other features of the invention may be attained by providing in combination: a wearable electric field detector, the detector including a housing adapted to be mounted on a user's person, a sensing circuit disposed in the housing and responsive to an electric field for generating a sense signal which varies in proportion to the strength of the sensed field, and an alarm circuit coupled to the sensing circuit for producing an indication of the sensed field; and a carrying case adapted to receive the housing and including shield material for shielding the sensing circuit from electric fields when the detector is disposed in the carrying case.

The invention consists of certain novel features and a combination of parts hereinafter fully described, illustrated in the accompanying drawings, and particularly pointed out in the appended claims, it being understood that various changes in the details may be made without departing from the spirit, or sacrificing any of the advantages of the present invention.

BRIEF DESCRIPTION OF THE DRAWINGS

For the purpose of facilitating an understanding of the invention, there is illustrated in the accompanying drawings a preferred embodiment thereof, from an inspection of which, when considered in connection with the following description, the invention, its construction and operation, and many of its advantages should be readily understood and appreciated.

FIG. 5 is a front elevational view of a detector in accordance with another embodiment of the invention;

FIG. 7 is a front elevational view of a carrying case for the detector of the present invention, illustrating insertion of the detector of FIG. 5;

FIG. 8 is a front elevational view of the carrying case of FIG. 7 in its closed condition;

FIG. 9 is a side elevational view of the carrying case of FIG. 8 as viewed from the left-hand side thereof; and FIG. 10 is a fragmentary sectional view taken generally along the line 10—10 in FIG. 7.

DESCRIPTION OF THE PREFERRED EMBODIMENTS

Figure 1:
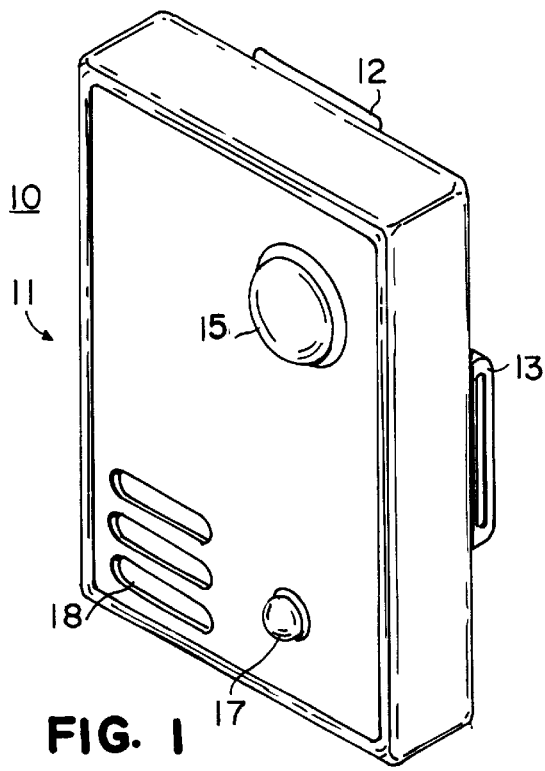
FIG. 1 is a front perspective view of an electric field detector in accordance with a first embodiment of the present invention.
Figure 2:
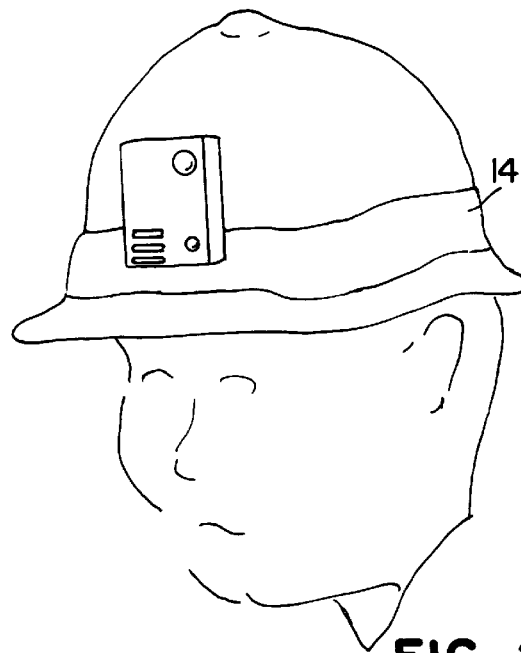
FIG. 2 is a reduced perspective view of the detector of FIG. 1, shown mounted on a user's helmet.
Figure 3:
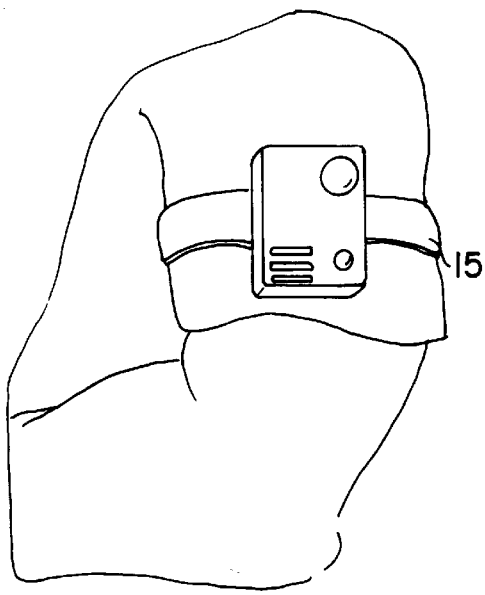
FIG. 3 is a reduced perspective view of the detector of FIG. 1, shown mounted on a user's arm.
Figure 4:
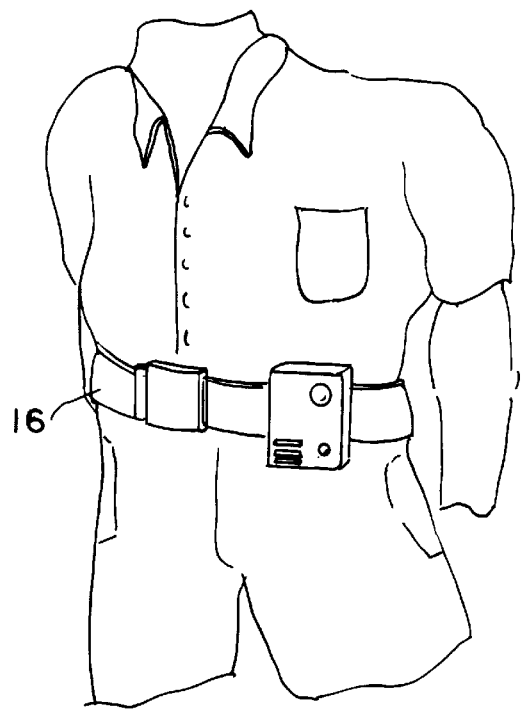
FIG. 4 is a reduced perspective view of the detector of FIG. 1, shown mounted on the user's belt.

Referring to FIGS. 1–4, there is illustrated a detector assembly generally designated by the numeral 10, including a box-like housing 11 provided with a clip 12 and a band or belt loop 13 on the rear side thereof. The clip 12 facilitates mounting on the housing 11 of an article of apparel, such as a headband 14 (see FIG. 2), a pocket, or the like, while the loop 13 is adapted to receive an arm band 15 for mounting on a user's arm (see FIG. 3), a belt 16 for mounting on a user's belt (see FIG. 4) or the like. The detector assembly 10 includes at least one visible indicator, which may be in the form of an LED 17, and an audio indicator, such as a speaker 18, disposed in the housing 11 behind suitable grille openings. The assembly 10 may also be provided with a test button 19.

Referring to FIG. 5, there is shown an alternative form of housing 20 for the detector assembly, which also includes an additional LED 21, for a purpose to be explained below.

Figure 6:
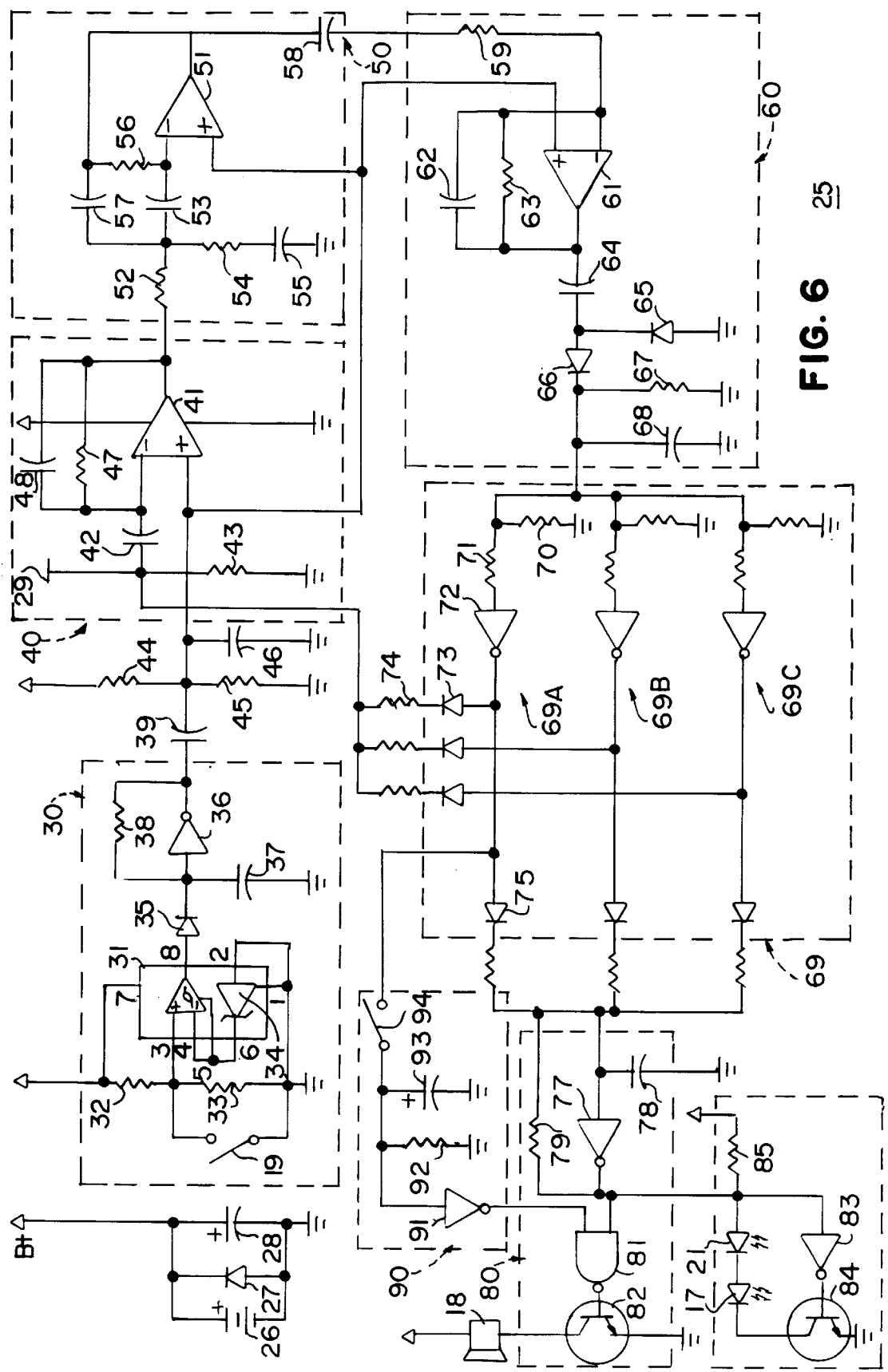
FIG. 6 is a schematic circuit diagram of the electrical circuitry of the detectors of FIGS. 1 and 5.

Referring to FIG. 6, the detector assembly 10 includes a detector circuit 25 disposed within the housing 11 or 20. The circuit 15 is preferably powered by a suitable battery 26, preferably a 9 VDC alkaline battery, shunted by a diode 27 and a capacitor 28 and providing a B+ supply voltage. The capacitor 28 serves as a general-purpose filter and the diode 27 protects the circuitry of the detector circuit 25 from damage in the event of an incorrectly installed battery. The detector circuit 25 also has a sensor electrode 29, preferably a small copper plate about one square inch in area, which acts as an antenna to pick up the voltage from an electric field and generate a very low-voltage signal in response, all in a known manner.

The detector circuit 25 includes a low-battery and self-test circuit 30, which includes an integrated circuit 31, which may be a MAX 931 and functions as the voltage comparator, comparing a fixed fraction of a battery voltage to an internal fixed reference voltage. More specifically, resistors 32 and 33 are connected in series across the B+ supply and form a voltage divider, the junction between those resistors being coupled to a non-inverting comparator input terminal of the IC 31 to provide the predetermined fraction of the battery voltage. The IC 31 also has an internal Zener diode 34, the anode of which is connected to ground and the cathode of which is coupled to the inverting input of the comparator to provide a fixed reference. The resistor 33 is shunted by the test switch 19. The output of the comparator of IC 31 at pin 8 is applied to the anode of a diode 35, the cathode of which is connected to an inverter 36 and, through a capacitor 37, to ground. The inverter 36 is shunted by a resistor 38.

When the battery voltage drops below a preset level, the battery input to the comparator drops below the threshold level, causing the output of the circuit to go low, this low being inverted to a high level which is applied through a coupling capacitor 39 to an amplifier 40. As will be explained more fully below, this will cause an alarm to be activated as if the circuit were in the presence of an electric field. The test switch 19 allows the user to test the operation of the detector circuit 25 before each use. Closing the switch simulates a discharged battery and causes the comparator to act as if the battery were low, sounding the alarm. The inverter 36, capacitor 37 and resistor 38 cooperate to form an AC voltage generator which converts the DC output of the comparator to an AC signal, which is coupled through the capacitor 39 to the input of the amplifier 40.

The amplifier 40 includes an IC op amp 41, the inverting input of which is coupled to the sense electrode 29 through a capacitor 42, the electrode 29 also being connected to ground through a resistor 43. Resistors 44 and 45 are connected across the B+ supply, the junction therebetween being coupled to the non-inverting input of the op amp 41, which is also connected to ground through a capacitor 46. The output of the op amp 41 is connected to its inverting input through a parallel combination of a resistor 47 and a capacitor 48. The amplifier 40 serves to amplify the very low voltage signal from the sense electrode 29.

The output of the amplifier 40 is coupled through a bandpass filter 50, which excludes voltages outside a narrow frequency band of approximately 50–60 Hz., to render the detector circuit 25 responsive only to power line frequencies. More particularly, the bandpass filter 50 includes an op amp 51, the inverting input terminal of which is connected to the output of the amplifier 40 through the series connection of a resistor 52 and a capacitor 53, the junction between these latter components being connected to ground through the series connection of a resistor 54 and a capacitor 55. The non-inverting input terminal of the op amp 51 is connected to the output of the low-battery, self-test circuit 30. The output of the op amp 51 is connected to its inverting input through a resistor 56 and, through a capacitor 57, to the junction between the resistor 52 and the capacitor 53. The bandpass filter 50 functions to amplify only voltages within the designated frequency band of 50–60 Hz. Thus, the circuit effectively prevents the detection of high-frequency electric fields from sources other than power lines, such as garage door openers, computers, radios and the like. The frequency band of this filter circuit 50 may be optionally set to include lower frequencies down to about 25 Hz. for detection of electric train electrified rails.

The output of the bandpass filter 50 is applied through a coupling capacitor 58 to an AC/DC converter 60. More particularly, the capacitor 58 is coupled through a resistor 59 to the inverting input terminal of an IC op amp 61, the non-inverting input of which is coupled to the voltage divider 44, 45. The output of the op amp 61 is connected to its inverting input through the parallel combination of a capacitor 62 and a resistor 63 and is also coupled through a capacitor 64 to the anode of a diode 66 and to the cathode of a diode 65 the anode of which is connected to ground. The cathode of the diode 66 is connected to ground through the parallel combination of a resistor 67 and a capacitor 68. The AC/DC converter 60 amplifies the power-frequency AC signal from the bandpass filter 50 and rectifies it to a proportional DC voltage.

The output of the AC/DC converter 60 at the cathode of the diode 66 is connected to a threshold detector array 69, including threshold detector circuits 69A, 69B and 69C, all of which are of similar construction, wherefore one will be described in detail. More specifically, the output of the AC/DC converter 60 is connected to the junction between two resistors 70 and 71, the former being connected to ground and the latter being connected to the input of an inverter 72, the resistors forming a voltage divider. The output of the inverter 72 is connected to the anode of a diode 73, the cathode of which is connected through a resistor 74 to the sense electrode 29. The output of the inverter 72 is also connected to the anode of a diode 75, the cathode of which is connected through a resistor 76 to a beeper 80.

More specifically, the resistor 76 is connected to the input of an inverter 77 and, through a capacitor 78, to ground, the output of the inverter 77 being connected to its input through a resistor 79. The output of the inverter 77 is connected to one input of a NAND gate 81, the output of which is connected to the base of a transistor 82, the emitter of which is connected to ground and the collector of which is connected through the speaker 18 to the B+ supply.

The output of the inverter 77 is also connected to an LED circuit and, more particularly, to the input of an inverter 83, the output of which is connected to the base of a transistor 84, the emitter of which is grounded and the collector of which is connected to the B+ supply through the series combination of the LEDs 17 and 21 and a resistor 85.

In operation, the amplitude of the AC signal generated by the sense electrode 29 will be proportional to the strength of the sensed electric field. Thus, the DC voltage at the output of the AC/DC converter 60 will also vary in proportion to the strength of the sensed field. The threshold detectors 69A–69C will be turned on sequentially as the strength of the detected field increases. Each of the circuits effectively measures the input DC voltage. Threshold detector 69A is the first to turn on, when the measured voltage is relatively low. This low voltage will turn on the beeper 80 with a slow intermittent beep, the intermittency being caused by the charging and discharging of the capacitor 78. As the voltage increases, threshold detectors 69B and 69C each turn on in turn, each acting to speed up the beeping rate. When the threshold detector 69C turns on, the beeper output will become continuous. Thus, it will be appreciated that the increase in beeping rate as a result of increasing sensed electric field strength is not continuous, but rather takes place in three discrete steps. It will be appreciated that when any of the threshold detectors 69A–69C is turned on, it will also serve to energize the LED's 17 and 21, which will blink at the same rate as the beeper.

The detector circuit 25 also includes a mute circuit 90 which cooperates with the NAND gate 81 to mute the beeper 80. More specifically, the mute circuit 90 includes an inverter 91, the output of which is connected to one of the inputs of the NAND gate 81 and the input of which is connected to ground through the parallel combination of a resistor 92 and a capacitor 93 and is also connected through a normally-open mute switch 94 to the output of the inverter 72 of the threshold detector 69A.

In operation, when no field is being detected, the outputs of the inverters 77 and 91 are both high, holding the output of the NAND gate 81 low and holding the beeper off. When a field is detected, the output of the inverter 77 periodically goes low, causing the output of the NAND gate 81 to periodically go high and activate the beeper. This has no effect on the inverter 91 because the mute switch 94 is open. When the user desires to mute the beeper, the mute switch 94 is closed momentarily, charging the capacitor 93 and causing the output of the inverter 91 to go low, turning off the beeper. The capacitor 93 gradually discharges through the resistor 92, and after this time delay the beeper is reenabled. Note that if no electric field is being detected, closing the mute switch 94 will have no effect. Thus, the mute circuit 90 is enabled only when the device is already detecting an electric field and the beeper 80 is already beeping, so that it cannot be accidentally or unknowingly muted. Furthermore, after muting, the mute circuit 90 will automatically time out and become disabled, so that the user does not have to worry about remembering to turn the mute circuit off. The time out can be varied by varying the values of the resistor 92 and the capacitor 93, but will typically be set for about five minutes. The mute circuit 90 is an optional feature of the invention and, therefore, the pushbutton mute switch is not illustrated in FIGS. 1 and 5 but, if included, will be accessible to a user through a suitable opening in the front of the housing 11 or 20.

It is a significant aspect of the invention that the detector circuit 25 does not have an on-off switch. Thus, the circuitry is always connected to the B+ supply. This is a safety feature to prevent the user from turning off the circuit and forgetting to turn it back on. Instead, referring to FIGS. 7–10, there is provided a shielded carrying case 100 for the detector assembly 10. The carrying case 100 is formed of suitable fabric material and is fashioned to provide an open-top pouch 101 made up of front and rear panels 102 and 103 stitched together along their side and bottom edges, the rear panel being provided with a cover flap 104 which can be folded over to close the open top of the pouch 101. The illustrated carrying case 100 has a round-bottom pouch 101 specifically shaped and dimensioned to receive the housing 20 in an inverted position, as illustrated in FIG. 7. It will be appreciated that, if the housing 11 is used, the carrying case will be made with a suitable complementary shape and size.

Significantly, the carrying case 100 is formed of a double-layered construction including an outer protective layer 105 (FIG. 10), made of canvas, nylon or the like, and provided with an inner lining 106 formed of a suitable electrically conductive fabric. A number of such fabrics are commercially available, such as fabrics woven of carbon-impregnated fibers. Preferably Velcro strips 107 and 108 are, respectively, provided on the cover flap 104 and on the outer surface of the front panel 102 for securing the flap in its closed position, illustrated in FIG. 8. The exposed edges of the carrying case 100 are preferably covered with a protective, wear-resistant edging strip 109, which may be formed of any suitable material and secured in place, as by stitching. A belt loop 110 may be attached to the rear panel 103.

It will be appreciated that, when the detector assembly 10 is confined within the carrying case 100, the conductive lining thereof acts as a Faraday shield to completely block all electric fields from the detector circuit 25. Thus, when the detector assembly 10 is confined within the carrying case 100 it is effectively disabled. When the user wishes to use the detector assembly 10, it is removed from the carrying case 100 and mounted on the user's person in a suitable manner, such as those illustrated in FIGS. 2–4.

From the foregoing, it can be seen that there has been provided an improved electric field monitor which is of simple and economical construction and is designed to prevent accidental disabling by the user and includes a variable-frequency audible alarm circuit which can be safely temporarily muted by the user.

While particular embodiments of the present invention have been shown and described, it will be apparent to those skilled in the art that changes and modifications may be made without departing from the invention in its broader aspects. Therefore, the aim in the appended claims is to cover all such changes and modifications as fall within the true spirit and scope of the invention. The matter set forth in the foregoing description and accompanying drawings is offered by way of illustration only and not as a limitation. The actual scope of the invention is intended to be defined in the following claims when viewed in their proper perspective based on the prior art.

I claim:

1. A wearable electric field detector comprising:
   a housing adapted to be mounted on a user's person,
   a sensing circuit disposed in the housing and responsive to an electric field for generating a sense signal which varies in proportion to the strength of the sensed field,
   an alarm circuit coupled to the sensing circuit for producing an indication of the sensed field;
   said alarm circuit including an audio annunciator for producing an audible alarm signal in response to the sense signal; and
   a normally disabled mute circuit coupled to the alarm circuit and enabled only when the alarm circuit is producing an indication of a sensed field, the mute circuit being selectively operable only when enabled for deactivating the audio annunciator without affecting the sensing circuit.

2. The detector of claim 1, and further comprising a manually-operable switch coupled to said mute circuit for selectively activating said mute circuit.

3. The detector of claim 2, wherein said mute circuit includes a deactivation circuit for automatically deactivating the mute circuit upon the occurrence of a predetermined condition after activation thereof.

4. The detector of claim 3, wherein the deactivation circuit includes a timing circuit for deactivating the mute circuit a predetermined time after activation thereof.

5. The detector of claim 1, and further comprising a clip carried by said housing for removably mounting the housing on a user's article of clothing.

6. The detector of claim 1, and further comprising a band or loop coupled to said housing for encircling a portion of a user's body.

7. The detector of claim 1, wherein said sensing circuit is responsive to only electric fields having a frequency in the range of from about 25 Hz to about 60 Hz.

8. The detector of claim 1, wherein said alarm circuit includes a visual annunciator for producing a visible alarm signal in response to the sense signal.

9. The detector of claim 1, and further comprising a test circuit coupled to said sensing circuit and to said alarm circuit for testing the operations thereof.

10. The detector of claim 1, wherein the alarm circuit includes circuitry for causing the audio annunciator to produce an intermittent audible alarm signal with a repetition rate which varies in proportion to the sensed signal.

11. In combination:
a wearable electric field detector,
said detector including a housing adapted to be mounted on a user's person,
a sensing circuit disposed in the housing and responsive to an electric field for generating a sense signal which varies in proportion to the strength of the sensed field, and
an alarm circuit coupled to the sensing circuit for producing an indication of the sensed field; and
a carrying case adapted to receive the housing and including shield material for shielding the sensing circuit from electric fields when the detector is disposed in the carrying case.

12. The combination of claim 11, wherein said shield material is an electrically conductive fabric.

13. The combination of claim 12, wherein the shield material is woven of carbon impregnated fibers.

14. The combination of claim 11, wherein the carrying case includes attachment structure to facilitate mounting thereof on a user's person.

15. The combination of claim 11, wherein the alarm circuit includes an audio annunciator for producing an intermittent audible alarm signal with a repetition rate which varies in proportion to the sensed signal.

* * * * *